United States Patent

[11] 3,588,741

[72] Inventor Bernard Glance
Colts Neck, N.J.
[21] Appl No 812,041
[22] Filed Apr. 1, 1969
[45] Patented June 28, 1971
[73] Assignee Bell Telephone Laboratories Incorporated
Murray Hill, N.J.

[54] MICROSTRIP SEMICONDUCTOR MOUNT WITH COMPOSITE GROUND PLANE
5 Claims, 4 Drawing Figs.

[52] U.S. Cl. .......... 331/96, 331/99, 331/107, 333/84
[51] Int. Cl. .......... H03b 7/14
[50] Field of Search .......... 331/96, 97, 99, 107 (G), 107 (T), 117 (D); 333/84 (M)

[56] References Cited
UNITED STATES PATENTS

| | | | |
|---|---|---|---|
| 3,209,282 | 7/1965 | Schnitzler .......... | 331/107(T) |
| 3,336,535 | 8/1967 | Mosher .......... | 331/99X |

OTHER REFERENCES

Lee et al., IEEE TRANSACTIONS ON ELECTRON DEVICES, Oct. 1968, pp. 741— 747 (331-107)

*Primary Examiner*—Roy Lake
*Assistant Examiner*—Siegfried H. Grimm
*Attorneys*—R. J. Guenther and E. W. Adams, Jr.

ABSTRACT: The present invention is a new form of microstrip mount for two-terminal semiconductor devices. Its elements include first: a large radial capacitor which acts as a DC connector and an RF decoupler between a DC bias source and one such device, and also acts as a composite ground plane for the RF signal generated in the device; and second: an adjustable conductive bridge which provides a DC path to one of the device terminals from one side of the radial capacitor and through the capacitor forms a cavity which resonates at the desired frequency with the reactance of the device. In one illustrative application, the invention is used in the construction of a microwave IMPATT oscillator having an extremely low Q and consequently a very high locking figure of merit.

INVENTOR
B. GLANCE
BY
ATTORNEY

MICROSTRIP SEMICONDUCTOR MOUNT WITH COMPOSITE GROUND PLANE

BACKGROUND OF THE INVENTION

The present invention relates to mounting circuits for two-terminal semiconductor devices.

The use of semiconductor devices in the generation of microwave power is increasing rapidly. Bulk-effect devices, avalanche diodes, varactors, and similar devices are finding wide application. In operation each of these devices must be mounted in some circuit which provides adequate heat removal, tuning and DC biasing. Since most common bias sources have very low RF impedances, they must somehow be decoupled from the RF signals generated in the device.

It is a recognized deficiency in the prior art that the various existing bias source decoupling means have an effect on the output RF signal. More specifically, it is recognized that a low-pass filter placed in parallel between the bias source and the device circuit adds to overall circuit Q and may cause spurious oscillations at unwanted frequencies to appear in the RF output. While the former effect may be desirable in some applications, it is not so in all, and the latter effect is always detrimental.

SUMMARY OF THE PRESENT INVENTION

The present invention concerns a mounting system and bias supply circuit which overcomes the above-mentioned effects and provides a very low Q circuit in which the bias source has no effect on the generated RF signal. The semiconductor device is connected between the lower conductive layer of a large radial capacitor which surrounds the device and an overlying conductive bridge. Both ends of the bridge are connected to the upper conductive layer of the capacitor, and each of the two DC bias source terminals is connected to one of the two conductive layers.

This configuration has several unique advantages over the prior art. The large radial capacitor simultaneously DC couples and RF decouples the bias source from the rest of the circuit while adding virtually no Q, and also provides a composite ground plane for the generated RF signal. The cavity formed by the conductive bridge on the upper layer of the capacitor acts as an adjustable inductance in series with the device as seen from the bias source and the bridge, in combination with the capacitor, completes the DC bias path through the device.

This basic configuration, in combination with other elements such as heat sinks and output coupling arrangements, may be used with several diverse semiconductor devices. In one embodiment for example, a varactor diode is inserted, resulting in an LC circuit having a variable reactance. A second and particularly useful alternative uses an IMPATT diode as the semiconductor device, producing a negative resistance microwave oscillator circuit with significant new features. The nature of the present invention and its various features will now be more fully discussed in connection with this illustrative embodiment, a low Q microwave oscillator circuit.

DETAILED DESCRIPTION

Figure 1:
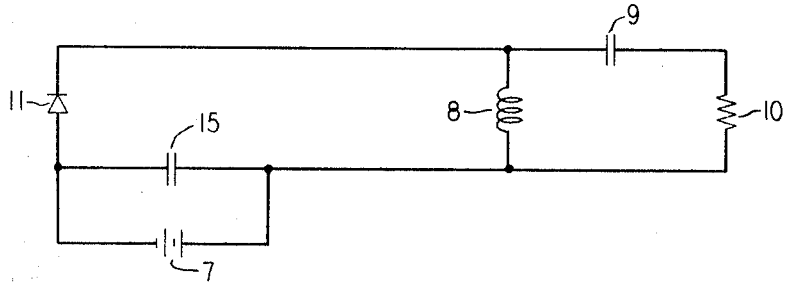
FIG. 1 is a schematic representation of a negative resistance oscillator circuit embodying the teachings of the present invention, utilizing an IMPATT diode as the negative resistance element.

Referring to FIG. 1, an IMPATT diode oscillator circuit is shown schematically embodying the teachings of the present invention. IMPATT diode 11, when biased into its negative resistance region, may be represented as a capacitor $C_{11}$ in parallel with a negative resistance $-R_{11}$. If inductance 8 and load resistance 10 (having value equal to the absolute value of $-R_{11}$) are added in parallel with each other across diode 11, an oscillator is formed, having a characteristic frequency equal to $1/2\pi\sqrt{L_8C_{11}}$ If load resistance 10 is not inherently of the proper value, variable coupling capacitor 9 may be added to transform the load resistance seen by the diode with negligible effect on the frequency of oscillation. The realization of this circuit requires that DC bias source 7 be added so that the diode is appropriately biased.

The insertion of the DC source, however, complicates the circuit design. The internal AC impedance of most DC sources is relatively low; and therefore unless it is decoupled from RF energy produced in the resonator tank circuit, the DC source will short the tank circuit and prevent oscillations from occurring. The prior art solved this problem by placing a low-pass filter in parallel between the DC bias source and the resonant circuit. Thus, DC bias current is directed from the bias source to the resonant circuit but generated RF energy is blocked from flowing back through the filter.

This decoupling means, however, has two recognized deficiencies. The first of these is that the prior art low-pass filter under some circumstances can cause spurious RF signals to appear in the output. To the tank circuit such a filter represents a reactive load. If the reactance of that load, when combined with the reactance of the tank circuit, produces circuit resonance at a frequency where the diode resistance is negative, unwanted oscillations can occur. Elimination of these oscillations requires that the low-pass filter itself be decoupled from the tank circuit by an attenuator, and this adds to circuit complexity and decreases gain.

Secondly, this decoupling means raises severe problems in the case of phase locked oscillators intended to have a wide locking bandwidth. Specifically the locking bandwidth, for a given ratio of output to injected power, is an inverse function of the overall circuit Q. A decoupling means including a low-pass filter adds to this Q because energy is stored in the filter's inductive element. Thus, use of a low-pass filter to decouple the DC source from the generated RF signal forces the designer to sacrifice locking bandwidth.

The present invention solves this dilemma by providing a means for connecting the DC source to the resonant circuit for bias purposes and decoupling it from the generated RF signal without adding Q or a source of spurious oscillations to the circuit. In FIG. 1, the schematic diagram of the resulting circuit shows only one new element, capacitor 15, connected in series between diode 11 and resonating inductance 8 in the tank circuit Its capacitance is made sufficiently large so that it is essentially a short circuit for the RF signal, and the DC bias is applied to the diode across it. In the circuit configuration shown, if the capacitance of element 15 is made very large over the frequency range of interest, its presence adds negligible energy storage to the circuit and therefore does not reduce the locking bandwidth. Inductance 8, the resonating element in the tank circuit, also inherently prevents capacitor 15 from shorting load resistance 10 at RF.

Figure 2:
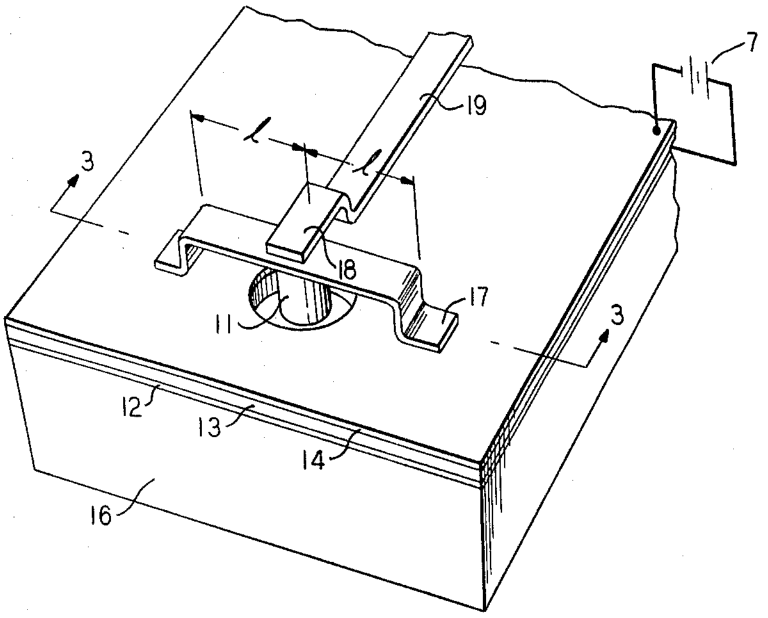
FIG. 2 is a perspective view of a physical realization of the circuit shown in FIG. 1.
Figure 3:
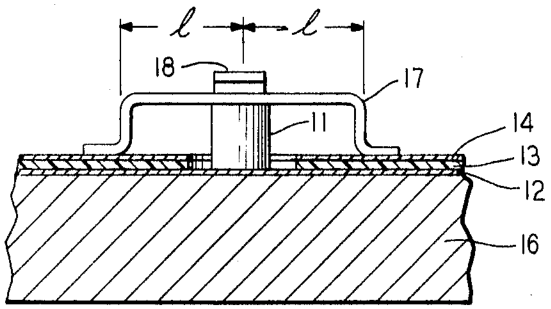
FIG. 3 is a cutaway view of the embodiment shown in FIG. 2 taken along the line 33.

The physical structure which accomplishes this result is shown in FIGS. 2 and 3. IMPATT diode 11 is mounted in a cavity built according to the teachings of the present invention. The cavity walls are formed by conductive bridge 17 and elements 12, 13 and 14. Together these last three elements comprise the physical realization of the component shown schematically in FIG. 1 as capacitor 15.

This multiple function capacitor is composed of electrically conducting plates 12 and 14 separated by thin dielectric layer 13 so that plates 12 and 14 are spaced apart no more than a small fraction of the RF wavelength. The minimum spacing is determined by the need to avoid arcing between the plates. Diode 11 is inserted through an opening in upper plate 14 and dielectric 13 so that its lower terminal makes contact with plate 12. Bridge 17 is connected at both ends to upper conducting plate 14 and DC bias is applied to diode 11 by means of plates 12 and 14. The DC path is as follows: source 7 to plate 14 to bridge 17 to diode 11 to plate 12 to source 7. Heat sink 16 may be composed of an electrical conductor such as copper or a high thermal conductivity dielectric such as beryllia. If it is electrically conductive, plate 12 may be omitted, and the bottom terminal of the device connected to sink 16 directly. In this construction neat sink 16 forms the lower half of capacitor 15 and is suitably connected to one side of bias source 7. If heat sink 16 is composed of a dielectric material, lower plate 12 is a necessary component of capacitor 15. In FIGS. 2 and 3, heat sink 16 may be considered to be of such a dielectric. As a planar capacitor, element 15 in whichever form constructed, has a much higher capacitance than the conventional coaxial or microstrip RF bypass used in waveguide, coaxial and prior art stripline circuits.

Each half of the cavity as seen from diode 11 may be considered as a two-wire transmission line shorted at one end. For such a configuration it can be shown theoretically that, if the length $l$ of the line remains substantially smaller than one-quarter wavelength of the generated RF signal, the reactance of the cavity seen by an element (such as the diode) mounted across the open end will be inductive and directly proportional to $l$. This feature has been experimentally verified: the frequency of oscillation of the system multiplied by $\sqrt{l}$ is constant. This means that the oscillation frequency can be controlled by varying a single external circuit parameter.

The operation of the present invention will now be apparent. A DC connection from one side of element 15 through the bridge and the diode and back to the other side of element 15 biases diode 11 into its negative resistance region. Since the diode equivalent reactance there is capacitive, if the rest of the tank circuit is inductively reactive sustained RF oscillations will occur. This condition is met by the two halves of the cavity which are seen by the bias source as a parallel pair of inductances in series with the diode. The reactance of element 15, which is in series with the diode and the inductance, is capacitive, but the capacitance is so large that at RF this reactance is negligible. Therefore, RF oscillations occur, causing relatively large AC current to flow in the tank circuit, between diode 11 and inductor 8.

The cavity impedance as noted is related to its physical dimensions. Therefore, if a pure resistance rather than an inductance is desired for a particular application, $l$ may be made equal to a quarter wavelength. Similarly, if a capacitive cavity reactance is desired, $l$ may be made greater than one quarter wavelength. Control over the cavity impedance is simply exercised in any case.

The generated RF signal is capacitively coupled to the output circuit across diode 11 by adjustable capacitor 9 which physically comprises end section 18 of output microstrip line 19 and the underlying segment of bridge 17. The two plates 12 and 14 of capacitor 15 act as a composite ground plane for the output signal in line 19 since the value of the capacitance is large enough to make it a virtual short circuit for the RF signal. The output capacitance and line impedance are adjusted for maximum output power, and if desired further coupling to coaxial line or waveguide may be added.

Thus the capacitive element comprising plates 12 and 14 and their separating dielectric 13 serves functions in both the bias and RF portions of the circuit. Likewise conductive bridge 17 physically completes the bias path and simultaneously performs the resonating function which produces the RF signal.

Because of the small amount of RF energy stored in this circuit, minimum Q and maximum locking bandwidth are obtained. For example, in experiments conducted at 32 GHz., a locking bandwidth of 2 GHz. has been realized for a gain of 22 db. and a FIG. of merit as high as 0.8 has been achieved.

Figure 4:
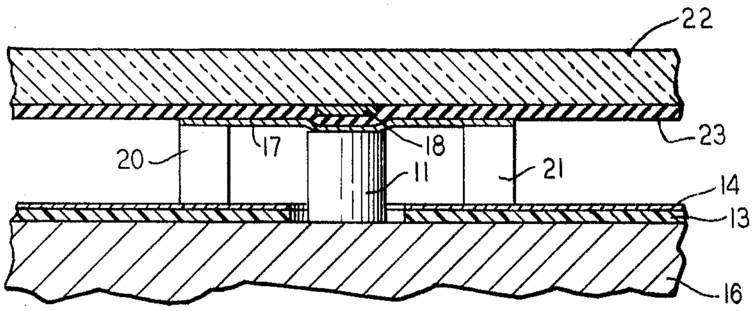
FIG. 4 is a cutaway view of an alternate version of the present invention used in an IMPATT diode oscillator circuit.

An alternative construction shown in FIG. 4 offers certain advantages over the version previously discussed, which may be considered a standard microstrip with an air dielectric. This construction uses inverted or triplate microstrip line, with diode 11 mounted between the electrically conductive heat sink 16 and the center portion of bridge 17. Plate 14 and dielectric 13 are laid on the ground plane and the cavity is completed by two metal studs 20 and 21 held between plate 14 and bridge 17. Section 18 is the end section of the normal strip conductor of the inverted microstrip line and is therefore laid directly on substrate 22. A layer of insulation 23 is added to provide capacitance between section 18 and bridge 17. This construction, while no different in principle from the version discussed, is less fragile and more compatible with other solid-state circuits. When inverted or triplate microstrip line is utilized, additional hybrid circuits may be deposited on the same substrate as the bridge, to provide other functions, such as down-conversion, up-conversion or phase locked operation of oscillators.

It should finally be noted that the embodiments discussed are merely illustrative and not exhaustive. For example, the cavity shape need not be rectangular. Rectangularly simplifies the impedance equations substantially and produces the useful relation between frequency of oscillation and cavity length, but it is not essential to the operation of the invention. Inductive, resistive, and capacitive cavity impedances may be obtained with or without a rectangular cross section. In some applications the cavity may only have one portion rather than two, in which case bridge 17 is replaced by an appropriate single conducting link between plate 14 and the upper terminal of diode 11. Similarly, for diverse applications semiconductor devices other than the IMPATT diode may be substituted as the active element. Further modifications will occur to those familiar with the art which do not depart from the spirit and scope of the present invention.

I claim:

1. In combination, a two-terminal semiconductor device, a strip transmission line structure comprising three spaced conductive members two of which have parallel areas large compared to the third and are spaced much closer to each other than to the third so that said two are effectively at the same radio frequency potential and serve as a ground plane with respect to said third, at least one of said two being thin, a source of direct current bias connected between said two members, means having a low impedance for both radio frequency and direct currents connecting one of said two members to one terminal of said device, means having a low direct current impedance and a high radio frequency impedance connecting the other of said two members and the other terminal of said device, and means for coupling said device to radio frequency energy supported between said third member and the ground plane comprising said two members.

2. A high frequency oscillator including a two-terminal semiconductor device having a capacitance reactance and negative resistance under the influence of an applied DC bias comprising:

two conducting members being spaced such that said members are substantially at the same RF potential, one conducting member at least being thin, a first terminal of said device being connected to the other member, means for applying a DC bias potential across said members, and means for electrically connecting said one member to a second terminal of said device, said one member in conjunction with electrically connecting means forming a substantially rectangular RF cavity across said device terminals, said cavity having a dimension $l$ substantially less than a one-quarter wavelength of the oscillator signal measured perpendicularly to the axis of said device and wherein the frequency of oscillation is inversely proportional to the square root of the dimension $l$.

3. A high frequency oscillator including a two-terminal semiconductor device which exhibits a particular reactance and negative resistance under the influence of an applied DC bias comprising:

two conducting members being spaced such that said members are substantially at the same RF potential, one conducting member at least being thin, a first terminal of said device being connected to the other member, means for applying a DC bias potential across said members, and a conductive bridge extending over said device to provide electrical contact between a second terminal of said device and the central portion of said bridge, said bridge being connected at both ends to said one member to produce an inductive reactance having two components across said device terminals, and the dimensions of said bridge being predetermined to produce a reactance which resonates with the particular device reactance at the frequency of oscillation.

4. A mounting and biasing system for a two-terminal DC biased semiconductor device comprising:

two conducting members being spaced such that said members are substantially at the same RF potential, one conducting member at least being thin, a first terminal of said device being connected to the other conducting member, means for applying the DC bias potential across said members, a section of transmission line center conductor, extensions of said conducting members extending in a plane parallel to said center conductor, the spacing between said conducting members being fixed such that said members are effectively at the same RF potential and form a composite RF ground plane with respect to said center conductor, means for electrically connecting said one member to a second terminal of said device, the connecting means in conjunction with said spaced members producing a reactance across said device terminals, the dimensions of the connecting means being predetermined to produce a particular value of reactance, and means for coupling said device to RF energy supported between said center conductor and said composite RF ground plane.

5. A mounting and biasing system for a two-terminal DC biased semiconductor device comprising:

two conducting members being spaced such that said members are effectively at the same RF potential, one conducting member at least being thin, a first terminal of said device being connected to the other conducting member, means for applying a DC bias potential across said members, and means for electrically connecting said one member to a second terminal of said device comprising a conductive bridge connected at both ends to said one member and being in electrical contact with said first terminal in its central portion to produce a reactance having two components, and the dimensions of said bridge being predetermined to produce a particular value of reactance.